United States Patent
Lucas et al.

(10) Patent No.: US 7,212,512 B2
(45) Date of Patent: May 1, 2007

(54) FREQUENCY CORRECTION SYSTEM FOR A WIRELESS DEVICE COMMUNICATING IN A WIRELESS LOCAL AREA NETWORK

(75) Inventors: L. Victor Lucas, Seattle, WA (US); Carl F. Andren, Indialantic, FL (US)

(73) Assignee: Conexant, Inc., Red Bank, NJ (US)

( * ) Notice: Subject to any disclaimer, the term of this patent is extended or adjusted under 35 U.S.C. 154(b) by 982 days.

(21) Appl. No.: 10/113,743

(22) Filed: Apr. 2, 2002

(65) Prior Publication Data

US 2003/0185158 A1    Oct. 2, 2003

(51) Int. Cl.
*H04Q 7/24* (2006.01)
(52) U.S. Cl. .................... 370/338; 370/350
(58) Field of Classification Search ................ None
See application file for complete search history.

(56) References Cited

U.S. PATENT DOCUMENTS

| | | | |
|---|---|---|---|
| 6,035,003 A | | 3/2000 | Park et al. |
| 6,337,589 B1 * | | 1/2002 | Ooishi ........................ 327/156 |
| 6,473,420 B1 * | | 10/2002 | Bourdeau et al. ........... 370/350 |
| 6,560,448 B1 * | | 5/2003 | Baldwin et al. ......... 455/234.1 |
| 6,633,616 B2 | | 10/2003 | Crawford |
| 6,724,804 B1 * | | 4/2004 | Kegasa et al. ............... 375/130 |
| 6,861,900 B2 * | | 3/2005 | Smidth ........................ 329/304 |
| 6,920,190 B2 * | | 7/2005 | Simmons et al. ........... 375/344 |
| 2003/0122632 A1 * | | 7/2003 | Smidth ........................ 332/103 |

* cited by examiner

*Primary Examiner*—Bob A. Phunkulh
(74) *Attorney, Agent, or Firm*—Thomas, Kayden, Horstemeyer & Risley

(57) ABSTRACT

A wireless transceiver including an oscillator, a radio, a baseband processor and MAC device that performs apiori frequency offset correction. The radio converts between RF signals and baseband signals. The baseband processor includes a frequency correction loop, an inverter and a combiner. The frequency correction loop generates a frequency offset signal based on a frequency difference between an oscillator reference frequency and frequency of a received signal. The inverter inverts the frequency offset signal and the combiner adjusts frequency of a transmit signal by the inverted frequency offset signal. The MAC processes received packets, identifies packets received from an AP, provides packets to the baseband processor for transmission, and controls the baseband processor to adjust transmit signals to a frequency of the AP. The baseband processor may include a memory or filter to store or update frequency offset values.

18 Claims, 3 Drawing Sheets

FREQUENCY CORRECTION SYSTEM FOR A WIRELESS DEVICE COMMUNICATING IN A WIRELESS LOCAL AREA NETWORK

FIELD OF THE INVENTION

The present invention relates to wireless communications, and more particularly to apriori frequency offset to improve wireless local area networks.

DESCRIPTION OF RELATED ART

A wireless local area network (WLAN) may be established in which one or more wireless devices are configured to communicate with each other via a wireless medium. Many communication standards are known, such as the Institute of Electrical and Electronics Engineers, Inc. (IEEE) 802.11 standard. Devices configured according to the IEEE 802.11b standard, for example, operate at a selected channel (e.g., channel 6) within a carrier frequency range of 2.40–2.483 gigahertz (GHz). Other standards or architectures are contemplated. Due to the nature of wireless communications, it is often desired to coordinate communications using a central device or hub. According to the point coordination function (PCF), wireless devices communicate with each other via a wireless medium and a central hub through which all wireless communications are made, such as an access point (AP) or the like. For the PCF class of operation, the coordination function logic is active in only one station in a basic service set (BSS) at any given time that the WLAN is in operation, where the AP serves as the PCF station.

An inherent problem with wireless communications is the synchronization of signals transmitted in the wireless medium. Theoretically, each device operates using the same frequency so that the receiver may quickly and accurately detect and, if necessary, acquire transmitted signals. Each device, however, uses a separate and independent crystal oscillator that serves as the frequency reference for the local device. Although crystal oscillators are relatively accurate, such as having an error range of approximately +/−25 parts per million (PPM), the relative error range may double between each pair of devices. At a selected carrier frequency of approximately 2.4 GHz, for example, the error difference between any two wireless devices may be as high as 50 PPM resulting in a frequency differential in the range of about 125 kilohertz (kHz). Since wireless communications are also inherently asynchronous, the phase differential exists between the transmitted signal and the local circuitry. The frequency and phase differential, combined with distortion properties of the wireless medium (e.g., multi-path interference), present significant mitigating factors that contribute to reduced success in packet detection and acquisition.

Each device may incorporate a phase-locked loop (PLL) circuit or the like that adjusts frequency and phase of received signals to overcome the frequency and phase differentials. The PLL circuit determines the frequency (and phase) differentials and generates a frequency offset signal that is combined with the received signal to adjust the signal to the local frequency. A significant frequency differential, however, consumes valuable ingest time to measure and adjust the frequency of the received signal. The frequency error problem is compounded in a WLAN situation in which multiple devices are operating with separate and slightly different frequency levels. The AP must re-adjust for each wireless device. Every other device must also re-adjust since it is not known which device is communicating until the frequency is adjusted and the packet header examined to determine whether the packet must be acquired or may otherwise be ignored.

SUMMARY OF THE PRESENT INVENTION

A frequency correction system for a wireless device operating in a wireless LAN in which communications are coordinated via a central hub according to an embodiment of the present invention includes a frequency correction circuit, an inverter, a combiner and a controller. The frequency correction circuit determines a frequency differential between a local frequency reference signal and a received signal and provides a frequency offset signal indicative thereof. The inverter inverts the frequency offset signal and provides an inverted frequency offset signal. The combiner adjusts frequency of a transmit signal by the inverted frequency offset signal. The controller controls whether a transmit signal is adjusted in frequency by the inverted frequency offset signal. In one configuration, the controller detects signals received from the central hub and controls the inverter and combiner to adjust transmit frequency to correspond to a frequency of at least one signal received from the central hub. In a specific embodiment, the central hub comprises an access point (AP) or the like performing the PCF according to the IEEE 802.11 standard.

A memory may be included for storing a frequency offset value indicative of the frequency offset signal. The memory may store a single value based on a frequency offset signal associated with a last valid transmission from the central hub. Alternatively, the memory may perform filter functions based on one or more frequency offset values, such as averaging a predetermined number of frequency offset values based on the last predetermined number of signals received from the central hub. The frequency correction circuit may comprise a frequency detector that asserts a frequency signal indicative of a received signal and a phase-locked loop (PLL). The PLL compares the frequency signal with a reference frequency signal and provides a corresponding frequency offset signal. The combiner used to adjust the frequency of transmit signals may be implemented as a complex multiplier, which may further be added to a transmit FIR filter.

The wireless device may be a wireless transceiver including an oscillator, a radio, a baseband processor and a media access control (MAC) device. The oscillator generates a frequency reference signal and may comprise a crystal oscillator or the like. The radio converts radio frequency (RF) signals transmitted in the wireless medium into baseband signals and converts baseband signals into RF signals for transmission in the wireless medium. The baseband processor includes a frequency correction loop, a receive circuit, an inverter and a combiner. The frequency correction loop generates a frequency offset signal based on a frequency difference between a reference frequency and a received signal and uses the frequency offset signal to synchronize received signals. The receive circuit de-formats the adjusted received signal into packets. The inverter inverts the frequency offset signal and provides an inverted frequency offset signal. The combiner adjusts frequency of a transmit signal by the inverted frequency offset signal. The MAC processes received packets, identifies packets received from a central hub or AP or the like, provides packets to the baseband processor for transmission, and controls the baseband processor to adjust transmit signals to a frequency of the AP. The baseband processor may include a memory or combined memory and filter as previously described.

A method of apriori frequency offset for a wireless transceiver communicating in a wireless LAN in which communications are coordinated via a central hub according to an embodiment of the present invention includes generating a frequency offset signal in response to a received signal, determining whether the received signal was transmitted from the central hub, inverting the frequency offset signal if the received signal is from the central hub, and adjusting a transmit signal using the inverted frequency offset signal. The method may include storing a frequency offset value representing a frequency offset signal, where the inverting comprises generating the inverted frequency offset signal based on the stored frequency offset value. The storing may comprise replacing a stored frequency offset value with a new frequency offset value or otherwise updating a stored frequency offset value with new frequency offset value generated in response to a received signal from the central hub. The updating may comprise averaging a plurality of frequency offset values each generated in response to a signal received from the central hub.

BRIEF DESCRIPTION OF THE DRAWINGS

A better understanding of the present invention can be obtained when the following detailed description of embodiments of the invention is considered in conjunction with the following drawings, in which.

DETAILED DESCRIPTION OF EMBODIMENTS(S) OF THE INVENTION

Figure 1:
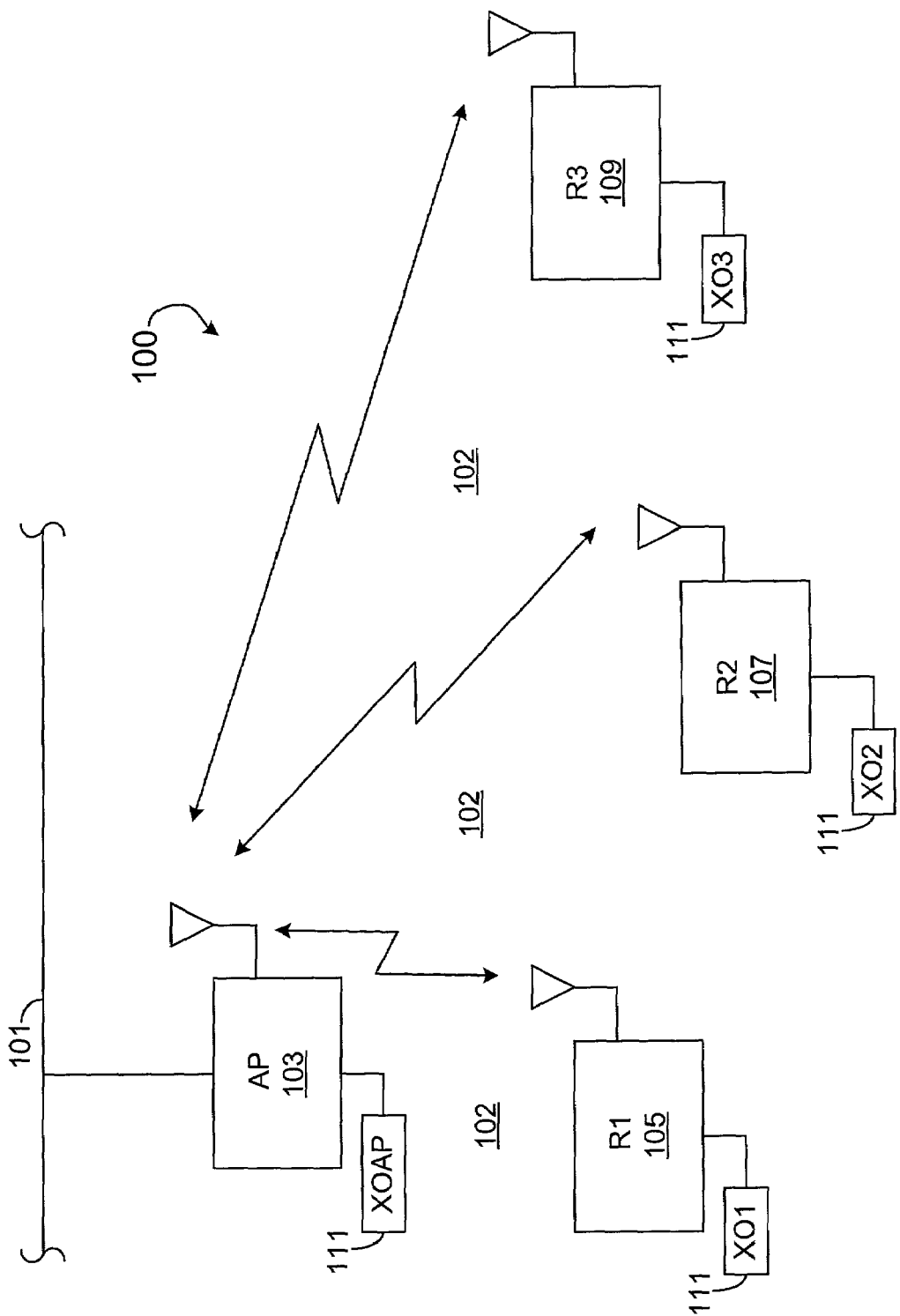
FIG. 1 is a block diagram of an exemplary wireless local area network (WLAN) used to illustrate embodiments according to the present invention.

FIG. 1 is a block diagram of an exemplary wireless local area network (WLAN) 100 used to illustrate embodiments according to the present invention. An access point (AP) 103 is coupled to a wired LAN 101 and wirelessly communicates with one or more other wireless devices 105, 107, 109, etc. via a wireless medium 102. The wireless devices 103–109 are configured to communicate according to the Institute of Electrical and Electronics Engineers, Inc. (IEEE) 802.11 WLAN standard at a selected channel (e.g., channel 6) within a carrier frequency range of 2.40–2.483 gigahertz (GHz). It is understood, however, that the present invention is not limited to any particular frequency range or communication architecture. According to the point coordination function (PCF) of the 802.11 standard, the wireless devices 105–109 wirelessly communicate with the LAN 101, the AP 103 and/or each other via the AP 103, which serves as a central hub through which all wireless communications are made. For the PCF class of operation, the coordination function logic is active in only one station in a basic service set (BSS) at any given time that the WLAN 100 is in operation, where the AP 103 serves as the PCF station.

Each of the wireless devices 105–109 tunes to the selected center frequency of the AP 103 when receiving packets form the AP 103. Each of the wireless devices 103–109 incorporates or otherwise includes a separate and independent crystal oscillator (XO) 111, which oscillates at a corresponding reference frequency rate for the underlying device. As shown, for example, the wireless devices 103–109 include crystal oscillators XOAP, XO1, XO2 and XO3, respectively. The crystal oscillators 111 are relatively accurate, such as having an error range of approximately +/−25 parts per million (PPM). At a selected carrier frequency of approximately 2.4 GHz, however, the error difference between any two wireless devices 103–109 may be as high as 50 PPM resulting in a frequency differential in the range of about 125 kilohertz (kHz). In this manner, there is a substantial likelihood that a considerable frequency offset range exists between the AP 103 and one or more of the wireless devices 105–109.

As described further below, each of the wireless devices 103–109 incorporates a phase-locked loop (PLL) feedback circuit that synchronizes the local oscillator with the phase and frequency of a received signal. The PLL circuit determines the frequency and phase differentials between the local oscillator and the received signal and adjusts the frequency and phase of the received signal accordingly to facilitate synchronization and acquisition of the incoming signal. If the wireless devices 105–109 only received packets from the AP 103, then the PLL circuit could eventually adjust to the frequency offset of the AP 103 and remain relatively stable. However, since all of the wireless device 103–109 may transmit and since each packet transmitted in the wireless medium 102 must be examined to determine source and destination, the PLL circuit is not locked at or near any particular frequency offset and is usually adjusted for each packet from a different device. The AP 103 may also include a similar PLL circuit that adjusts the frequency of signals transmitted by each of the other wireless devices 105–109. Normally, the PLL circuit of the AP 103 would also be constantly adjusting depending on the transmitting device.

As described further below, each of the wireless devices 105–109 determines a frequency offset from a last valid reception from the AP 103 to that device and applies a corresponding inverted offset for subsequent transmissions. In this manner, the PLL circuit of each of the wireless devices 103–109 converges to a corresponding frequency offset between the local frequency and the common frequency so that all transmit at approximately the same frequency.

Figure 2:
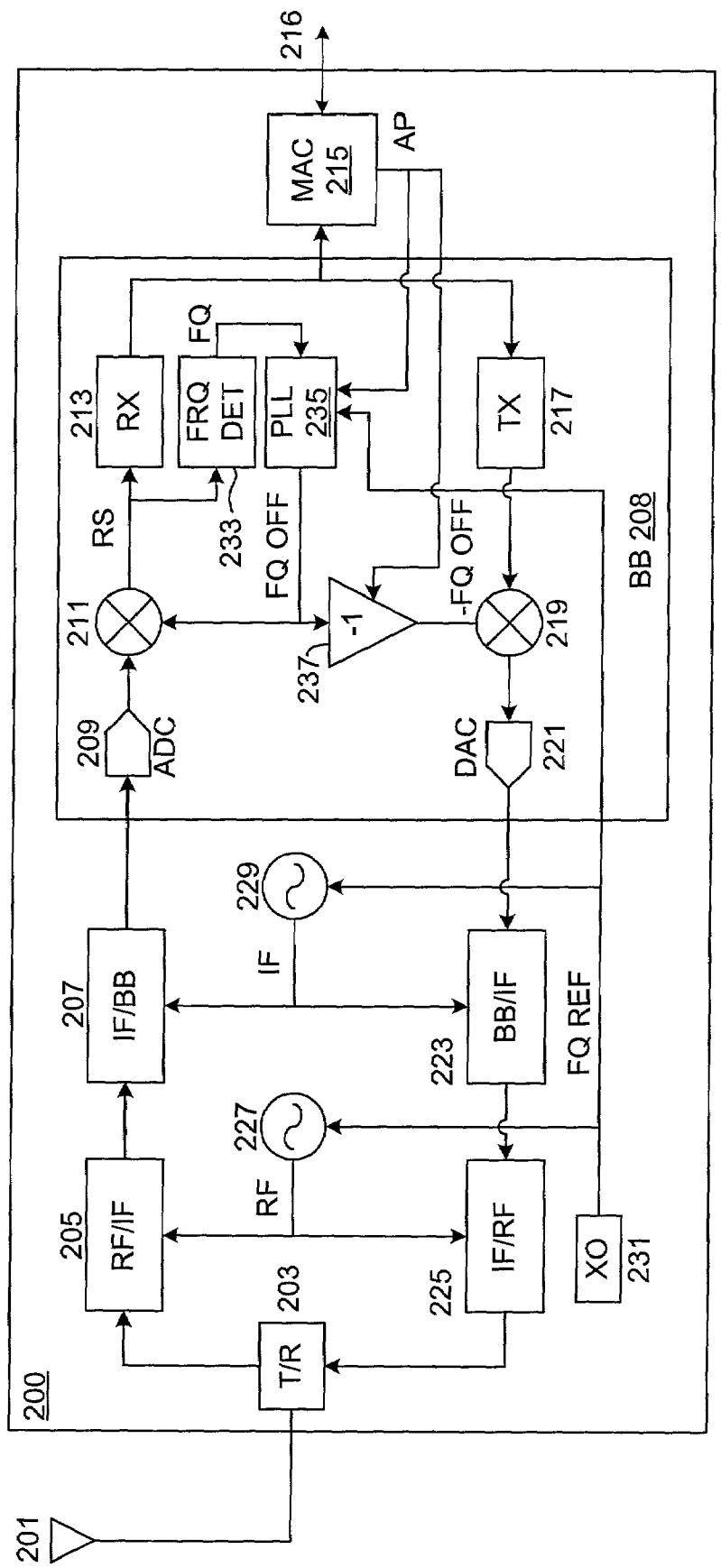
FIG. 2 is a block diagram of an exemplary transceiver that may be used by each of the wireless devices of FIG. 1 to enable wireless communications in accordance with an embodiment of the present invention.

FIG. 2 is a block diagram of an exemplary transceiver 200 that may be used by each of the wireless devices 105–109 to enable wireless communications in accordance with an embodiment of the present invention. The transceiver 200 may also be used by the AP 103 if desired. Radio Frequency (RF) signals transmitted near the applicable or selected frequency range are detected by an antenna 201 and provided to an RF/IF 205 block for processing via a transmit/receive (T/R) switch 203 (positioned in receive mode). In the embodiment shown, the RF/IF block 205 converts the signals to a selected intermediate frequency (IF) and provides the IF signals to an IF/BB block 207. The IF/BB block 207 converts the IF signal to baseband (BB) signals and provides the BB signals in analog format to a BB processor 208. The BB processor 208 includes an analog to digital converter (ADC) 209, which converts the analog BB signals to digital format, and provides the digital BB signals to one input of a 2-input complex multiplier 211. The complex multiplier 211 receives a frequency offset (FQ OFF) signal at its other input, multiplies the signals together to adjust frequency and phase, and provides an adjusted receive signal (RS) at its output to a receiver (RX) circuit 213. The RX circuit 213 de-formats the RS digital signal into a packet, and provides the packetized information to a media access control (MAC) device 215. The MAC 215 processes the received information as known to those skilled in the art. For example, data received for local consumption by an underlying device, such as a computer, is forwarded via link 216.

The MAC 215 forwards packet data for transmission to a transmit (TX) circuit 217, which provides corresponding formatted digital information to one input of another 2-input complex multiplier 219. This represents the complex phasor representation of the desired transmit signal. In one embodiment, the complex multiplier 219 is combined with a transmit finite impulse response (FIR) filter, not shown. The complex multiplier 219 receives an inverted frequency offset (−FQ OFF) signal at its other input, and supplies a frequency adjusted digital transmit signal to a digital to analog converter (DAC) 221. The −FQ OFF signal is a complex phasor which is rotating opposite to the direction of the original RS signal before adjustment. The DAC 221 provides corresponding BB transmit analog signals to a BB/IF block 223, which generally performs the inverse functions of the IF/BB block 207 to convert the BB transmit information into a selected IF signal. The BB/IF block 223 provides a corresponding IF signal to an IF/RF block 225, which generally performs the inverse functions of the RF/IF block 205 to convert the IF transmit information into a selected RF signal suitable for transmission via the antenna 201. The T/R switch is selectively positioned in transmit mode for transmission of wireless information via the wireless medium 102.

It is understood that the illustrated embodiment is simplified in that many functional blocks or specific circuitry is not shown for purposes of clarity. Furthermore, alternative configurations are contemplated without departing from the spirit and scope of the present invention. For example, a zero-intermediate frequency (ZIF) embodiment is contemplated in which the IF portions are omitted so that information is converted directly between RF and BB. The present invention is applicable to either configuration, among others.

The mixer functions of the IF/RF block 225 and the RF/IF block 205 are based on an RF reference signal generated by a local oscillator (LO) 227, which is further referenced to a crystal oscillator 231. Likewise, the mixer functions of the IF/BB block 207 and the BB/IF block 223 are based on an IF reference signal generated by a LO 229, which is referenced to the crystal oscillator 231. The crystal oscillator 231 is shown in simplified format providing a frequency reference (FQ REF) signal to the LO's 227, 229, where it is understood that separate reference signals may be generated. As described previously, although the local crystal oscillator 231 is relatively accurate, the RS signal is generated using a separate and independent crystal oscillator so that it is not synchronized with the local circuitry. In this manner, the RS signal, being a complex signal with phase and amplitude information, initially tends to "spin" or "roll" over time due to lack of synchronization.

The transceiver 200 further includes a frequency detection block 233 that detects the specific frequency and phase of the RS signal and that asserts a frequency (FQ) correction signal indicative thereof. The FQ correction signal is provided to a phase-locked loop (PLL) block 235, which is referenced to the crystal oscillator 231, such as by receiving the FQ REF signal. The PLL block 235 generates the FQ OFF signal that represents the frequency and phase error (offset) of the RS signal relative to the FQ REF signal or a derivative thereof. The complex multiplier 211 multiplies the FQ OFF signal to de-spin the RS signal so that it is synchronized to zero frequency and phase for consumption by the RX circuit 213.

It is appreciated that a similar yet opposite situation exists when the transceiver 200 transmits a packet to the wireless device from which a packet was received. For example, if the other wireless device operates with an oscillator that is slightly higher in frequency so that a corresponding RS signal has a slightly higher frequency as referenced by the local oscillator, then a packet transmitted to that same wireless device will appear slightly lower in frequency to that device by about the same frequency offset. An inverter circuit 237 is provided with an input coupled to the receive the FQ OFF signal and an output that supplies an inverted FQ OFF signal, shown as −FQ OFF, which is provided to the second input of the complex multiplier 219. The complex multiplier 219 mixes the −FQ OFF value with a digital transmit signal from the TX 217 to adjust the transmit frequency. Since the Local Oscillators 227, 229 are based on the local crystal oscillator 231, the mixer functions of the BB/IF block 223 and IF/RF block 225 maintain the relative frequency offset. In this manner, the transmitted signal is adjusted by the appropriate frequency offset so that the frequency of the transmitted signal is equivalent to the frequency of a signal received, such as a packet from the AP 103. In the simplified embodiment shown, the MAC 215 determines when a packet is received from a predetermined target device, such as the AP 103, and asserts at least one of multiple AP signals to the PLL 235 to store or otherwise hold the corresponding FQ OFF signal as the default or updated frequency offset signal. When the MAC 215 determines to transmit a packet, it controls the inverter circuit 237 to assert the −FQ OFF signal to the complex multiplier 219. The PLL circuit is operated for each received packet in the event a packet is transmitted at a different frequency, where the loop requires little adjustment if the packet is based on the same, common frequency level. If from the AP 103, the FQ OFF from the PLL 235 may be updated to be applied to subsequent transmissions.

Referring back to FIG. 1, if the wireless devices 105–109 employ the transceiver 200, then each conform to the frequency of the AP 103, so that all of the wireless devices of the WLAN 100 eventually transmit using approximately the same frequency level. Slight adjustments may be made over time due to changes in the wireless medium 102. The receiver for each wireless device 103–109 operates more efficiently since all devices operate at approximately the same frequency level. The typical correlator frequency offset is reduced or otherwise eliminated so that associated losses are also reduced or eliminated. Double ingest is not required. There is little or no loss from frequency estimate variance. A frequency estimate may still be made to handle non-typical situations. Additional processing time becomes available during packet preambles since frequency uncertainty is significantly reduced, so that performance is improved. This enables the possibility of shortening the preamble or using an improved algorithm for antenna diversity (in the event multiple antennas are employed). A longer CIR (channel impulse response) ingest and improved DC offset compensation are achieved. A greater number of SFD (start frame delimiter) bits can be used. A system according to embodiments of the present invention works with or without locked oscillators. The carrier and symbol estimates can be independent. Symbol timing is relatively accurate and the timing buffer length with the same memory is effectively doubled. It is noted that once a packet from one AP is acquired, packets from another AP can still be received by normal operation of the PLL feedback circuit.

Figure 3:
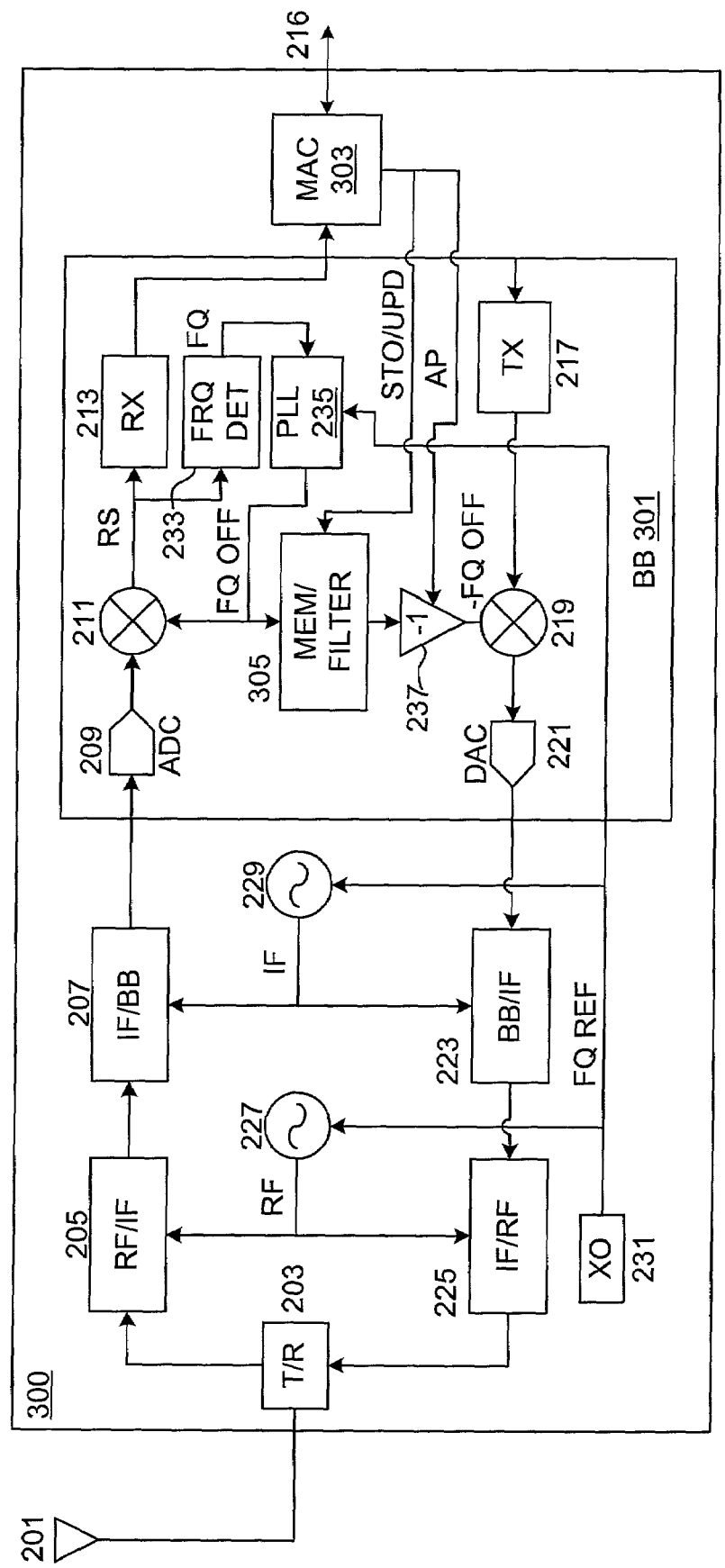
FIG. 3 is a block diagram of another exemplary transceiver similar to the wireless transceiver of FIG. 2 and including a memory or combined memory and filter for storing and applying the frequency offset.

FIG. 3 is a block diagram of another exemplary transceiver 300 that is similar to the wireless transceiver 200. Similar components assume identical reference numbers. The transceiver 300 includes a modified MAC 303 and BB processor 301, which includes a memory/filter 305 provided at the input of the inverter circuit 237 and controlled by the MAC 303. In particular, a STO/UPD signal is asserted by the MAC 303 to store the FQ OFF signal into the memory/filter 305 or to otherwise update the value in the memory/filter 305 using the latest FQ OFF signal. An AP signal is asserted by the MAC 303 to apply the stored frequency offset in the memory/filter 305 to adjust the transmission frequency of a packet. The stored frequency offset value is inverted by the inverter circuit 237 to determine the –FQ OFF signal in a similar manner as previously described. The memory/filter 305 provides the advantage of storing a frequency offset value, such as generated in response to a valid AP reception, and allowing the frequency correction loop 233, 235, 211 to operate on subsequent received signals.

In one embodiment, the memory/filter 305 filters each new FQ OFF signal to update any existing FQ OFF value, such as an existing value based on prior FQ OFF signals. The filtering may be based on any desired formula or algorithm, such as, for example, averaging. In the averaging embodiment, the last predetermined number of FQ OFF signals are averaged by the memory/filter 305 so that the stored FQ OFF value is an average of two or more values. The number of values that are averaged is somewhat arbitrary, may be determined experimentally, and may be fixed or variable based on desired operation. In an alternative embodiment, the memory/filter 305 stores the latest FQ OFF value by overwriting any previous values. The name "memory/filter" is intended to imply either memory or combined memory and filter functionality.

In yet further embodiments, the memory/filter 305 stores multiple FQ OFF values, each corresponding to a particular wireless device in the WLAN 100. Such embodiment may be used, for example, if more than one AP exists in the WLAN 100, so that a separate FQ OFF value is maintained for each. The MAC 303 may be used to control the memory/filter 305 to store multiple values and corresponding addresses. In the multiple offset value configuration, each value may be based solely on the last received communication from the corresponding device, or may be a filtered or combined value based on multiple communications, such as the averaging technique described above.

Although a system and method according to the present invention has been described in connection with one or more embodiments, it is not intended to be limited to the specific form set forth herein, but on the contrary, it is intended to cover such alternatives, modifications, and equivalents, as can be reasonably included within the spirit and scope of the invention as defined by the appended claims.

The invention claimed is:

1. A frequency correction system for a wireless device operating in a wireless LAN in which communications are coordinated via a central hub, comprising:
   a frequency correction circuit that determines a frequency differential between a local frequency reference signal and a received signal and that provides a frequency offset signal indicative thereof;
   an inverter, coupled to the frequency correction circuit, that inverts the frequency offset signal and that provides an inverted frequency offset signal;
   a combiner, coupled to the inverter, that adjusts frequency of a transmit signal by the inverted frequency offset signal; and
   a controller, coupled to the frequency correction circuit, the inverter and the combiner, that controls whether a transmit signal is adjusted in frequency by the inverted frequency offset signal wherein the controller detects signals received from the central hub and controls the inverter and combiner to adjust transmit frequency to correspond to a frequency of at least one signal received from the central hub.

2. The frequency correction system of claim 1, further comprising:
   a memory, coupled to the frequency correction circuit, the controller and the inverter, that stores a frequency offset value indicative of the frequency offset signal; and
   the inverter generating the inverted frequency offset signal based on the stored frequency offset value.

3. The frequency correction system of claim 2, wherein the memory further comprises a filter controlled by the controller to adjust the frequency offset value for each new signal received from the central hub.

4. The frequency correction system of claim 3, wherein the filter averages a predetermined number of frequency offset values based on the last predetermined number of signals received from the central hub.

5. The frequency correction system of claim 1, wherein the frequency correction circuit comprises:
   a frequency detector that asserts a frequency signal indicative of a received signal; and
   a phase-locked loop, coupled to the frequency detector, that compares the frequency signal with a reference frequency signal and that provides a corresponding frequency offset signal.

6. The frequency correction system of claim 1, wherein the combiner comprises a complex multiplier.

7. A wireless transceiver for communicating in a wireless LAN in which communications are coordinated via an access point (AP), comprising:
   an oscillator that generates a frequency reference signal;
   a radio, coupled to the oscillator, that converts radio frequency (RF) signals transmitted in a wireless medium into baseband signals and that converts baseband signals into RF signals for transmission in the wireless medium;
   a baseband processor, coupled to the oscillator and the radio, comprising:
      a frequency correction loop that generates a frequency offset signal based on a frequency difference between a reference frequency and a received signal and that uses the frequency offset signal to synchronize the received signal;
      a received circuit, coupled to the frequency correction loop, that de-formats the adjusted received signal into packets;
      an inverter, coupled to the frequency correction loop, that inverts the frequency offset signal and that provides an inverted frequency offset signal; and
      a combiner, coupled to the inverter, that adjusts frequency of a transmit signal by the inverted frequency offset signal; and
   a media access control (MAC) device, coupled to the baseband processor, that processes received packets, that identifies packets received from the AP, that provides packets to the baseband processor for transmission, and that controls the baseband processor to adjust transmit signals to a frequency of the AP.

8. The wireless transceiver of claim 7, further comprising:
the baseband processor including a memory, coupled to the frequency correction loop and the inverter, that stores a frequency offset value based on at least one frequency offset signal; and
the MAC device controlling the memory to update a frequency offset value using a frequency offset signal based on a signal received from the AP.

9. The wireless transceiver of claim 8, wherein the memory replaces a stored frequency offset value with a new frequency offset value.

10. The wireless transceiver of claim 8, wherein the memory incorporates a filter that averages a plurality of frequency offset values.

11. The wireless transceiver of claim 7, wherein the frequency correction loop comprises:
a frequency detector that asserts a frequency signal indicative of frequency of a received signal;
a phase-locked loop (PLL), coupled to the frequency detector and the crystal oscillator, that generates a frequency offset signal; and
a complex multiplier, coupled to the PLL and the receive circuit, that adjusts frequency of the received signal by the frequency offset signal.

12. The wireless transceiver of claim 7, the baseband processor further comprising:
a transmit circuit that formats packets received from the MAC into transmit signals; and
the combiner comprising a complex multiplier that combines transmit signals from the transmit circuit with inverted frequency offset signals from the inverter.

13. A method of apriori frequency offset for a wireless transceiver communicating in a wireless LAN in which communications are coordinated via a central hub, comprising:

generating a frequency offset signal in response to a received signal;
determining whether the received signal was transmitted from the central hub;
inverting the frequency offset signal if the received signal is from the central hub; and
adjusting a transmit signal using the inverted frequency offset signal; and
storing a frequency offset value representing a frequency offset signal wherein
said inverting comprising generating the inverted frequency offset signal based on the stored frequency offset value.

14. The method of claim 13, wherein said storing comprises replacing a stored frequency offset value with a new frequency offset value generated in response to a new received signal from the central hub.

15. The method of claim 13, wherein said storing comprises updating a stored frequency offset value using a new frequency offset value generated in response to a new received signal from the central hub.

16. The method of claim 15, wherein said updating comprises averaging a plurality of frequency offset values each generated in response to a signal received from the central hub.

17. The method of claim 13, wherein said generating a frequency offset signal comprises:
determining a frequency of the received signal;
comparing the frequency of the received signal with a reference frequency.

18. The method of claim 13, wherein said adjusting a transmit signal comprises complex multiplying a transmit signal with an inverted frequency offset value.

* * * * *